United States Patent
Ker et al.

(10) Patent No.: US 9,929,151 B2
(45) Date of Patent: Mar. 27, 2018

(54) SELF-BALANCED DIODE DEVICE

(71) Applicant: AMAZING MICROELECTRONIC CORP., New Taipei (TW)

(72) Inventors: Ming-Dou Ker, Jhu-Bei (TW); Woei-Lin Wu, Zhubei (TW); James Jeng-Jie Peng, Taoyuan County (TW); Ryan Hsin-Chin Jiang, Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 15/467,286

(22) Filed: Mar. 23, 2017

(65) Prior Publication Data

US 2018/0053760 A1    Feb. 22, 2018

Related U.S. Application Data

(62) Division of application No. 15/241,469, filed on Aug. 19, 2016, now Pat. No. 9,786,653.

(51) Int. Cl.
*H01L 27/08* (2006.01)
*H01L 29/861* (2006.01)
(Continued)

(52) U.S. Cl.
CPC ...... *H01L 27/0814* (2013.01); *H01L 27/0255* (2013.01); *H01L 29/0657* (2013.01);
(Continued)

(58) Field of Classification Search
CPC .................. H01L 27/0266; H01L 29/8613
See application file for complete search history.

(56) References Cited

U.S. PATENT DOCUMENTS 9,117,669 B2   8/2015 Lin et al.
9,368,484 B1 * 6/2016 Chen ................... H01L 27/0248
(Continued)

FOREIGN PATENT DOCUMENTS

TW    201419490 A    5/2014
TW    201423952 A    6/2014
(Continued)

OTHER PUBLICATIONS

Corresponding Official Action From a Foreign Patent Office.

*Primary Examiner* — Moazzam Hossain
*Assistant Examiner* — Farun Lu
(74) *Attorney, Agent, or Firm* — Rosenberg, Klein & Lee

(57) ABSTRACT

A self-balanced diode device includes a substrate, a doped well, at least one first conductivity type heavily doped fin and at least two second conductivity type heavily doped fins. The doped well is arranged in the substrate. The first conductivity type heavily doped fin is arranged in the doped well, arranged in a line along a first direction, and protruded up from a surface of the substrate. The second conductivity type heavily doped fins is arranged in the doped well, arranged in a line along a second direction intersecting the first direction, respectively arranged at two opposite sides of the first conductivity type heavily doped fin, and protruded up from the surface of the substrate. Each second conductivity type heavily doped fin and the first conductivity type heavily doped fin are spaced at a fixed interval.

12 Claims, 4 Drawing Sheets

(51) Int. Cl.
*H01L 27/02* (2006.01)
*H01L 29/06* (2006.01)
*H01L 29/78* (2006.01)
*H01L 27/06* (2006.01)

(52) U.S. Cl.
CPC ........ *H01L 29/0692* (2013.01); *H01L 29/861* (2013.01); *H01L 27/0629* (2013.01); *H01L 29/785* (2013.01)

(56) References Cited

U.S. PATENT DOCUMENTS

2007/0045736 A1    3/2007   Yagishita
2015/0187753 A1    7/2015   Campi, Jr. et al.

FOREIGN PATENT DOCUMENTS

| TW | 201503377 A | 1/2015 |
|----|-------------|--------|
| TW | I496216 B | 8/2015 |

\* cited by examiner

SELF-BALANCED DIODE DEVICE

RELATED APPLICATIONS

This application is a Divisional patent application of co-pending application Ser. No. 15/241,469, filed on 19 Aug. 2016, now pending. The entire disclosure of the prior application Ser. No. 15/241,469 is considered a part of the disclosure of the accompanying Divisional application and is hereby incorporated by reference.

BACKGROUND OF THE INVENTION

Field of the Invention

The present invention relates to a diode device, particularly to a self-balanced diode device.

Description of the Related Art

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, may be rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current. Semiconductor devices including FinFETs are susceptible to extremely high voltage spikes such as an electrostatic discharge (ESD) transient. ESD is a rapid discharge that flows between two objects due to the built-up of static charge. ESD may destroy semiconductor devices because the rapid discharge can produce a relatively large current. For example, the US patent No. 20070045736 disclosed a semiconductor device including a gate electrode, a first transistor and a second transistor, wherein the first transistor and the second transistor respectively have a first active region and a second active region. The first active region is arranged in a direction perpendicular to the gate electrode. The second active region is arranged in a direction inclined relative to the gate electrode. The first active region and the second active region can improve the mobility of holes and electrons. However, there is no ESD production element installed in the semiconductor device. The US patent is silent with ESD protection.

To overcome the abovementioned problems, the present invention provides a self-balanced diode device, so as to solve the afore-mentioned problems of the prior art.

SUMMARY OF THE INVENTION

A primary objective of the present invention is to provide a self-balanced diode device, which uses at least one first conductivity type heavily doped fin arranged in a line along a first direction and at least two second conductivity type heavily doped fins arranged in a line along a second direction intersecting the first direction to establish at least two diodes which discharge uniform electrostatic discharge (ESD) currents, so as to reduce the semiconductor failures due to ESD.

To achieve the abovementioned objectives, the present invention provides a self-balanced diode device, which comprises a substrate, a doped well, at least one first conductivity type heavily doped fin, at least two second conductivity type heavily doped fins and an insulation layer. The substrate is a semiconductor substrate. The doped well is a P-type doped well or an N-type doped well. The doped well is arranged in the substrate. The first conductivity type heavily doped fin is arranged in the doped well, arranged in a line along a first direction, and protruded up from a surface of the substrate. The second conductivity type heavily doped fins are arranged in the doped well, arranged in a line along a second direction intersecting the first direction, respectively arranged at two opposite sides of the first conductivity type heavily doped fin, and protruded up from the surface of the substrate. For example, the first direction is perpendicular to the second direction. Each second conductivity type heavily doped fin and the first conductivity type heavily doped fin are spaced at a fixed interval. The doped well, the first conductivity type heavily doped fin and the second conductivity type heavily doped fins form at least two diodes. The insulation layer is arranged on the surface of the substrate and arranged between the first conductivity type heavily doped fin and each second conductivity type heavily doped fin. The first conductivity type heavily doped fin is coupled to a first voltage terminal, and the second conductivity type heavily doped fins are coupled to a second voltage terminal, and voltages of the first voltage terminal and the second voltage terminal forward bias the diodes to generate at least two uniform electrostatic discharge (ESD) currents through the diodes. The first conductivity type heavily doped fin is an N-type heavily doped fin, and the second conductivity type heavily doped fins are P-type heavily doped fins, and the first voltage terminal and the second voltage terminal are respectively a low voltage terminal and a high voltage terminal. Alternatively, the first conductivity type heavily doped fin is a P-type heavily doped fin, and the second conductivity type heavily doped fins are N-type heavily doped fins, and the first voltage terminal and the second voltage terminal are respectively a high voltage terminal and a low voltage terminal.

In the first embodiment, there are a plurality of second conductivity type heavily doped fins, a plurality of diodes and a plurality of ESD currents, and the insulation layer is arranged between the neighboring second conductivity type heavily doped fins. A plurality of first contacts is arranged on sidewalls and a top of the first conductivity type heavily doped fin and the insulation layer, arranged in a line along the second direction, and coupled to the first voltage terminal. Two second contacts are respectively arranged on sidewalls and tops of the second conductivity type heavily doped fins at the two opposite sides of the first conductivity type heavily doped fin, arranged on the insulation layer, arranged in a line along the first direction, and coupled to the second voltage terminal. An amount of the first contacts is equal to an amount of the second conductivity type heavily doped fins at each side of the first conductivity type heavily doped fin.

Compared with the first embodiment, the second embodiment further comprises a first heavily doped clamping fin. The first heavily doped clamping fin and the second conductivity type heavily doped fin belong to an identical conductivity type. The first heavily doped clamping fin is arranged in the doped well, is arranged in a line along the second direction, separates from the first conductivity type heavily doped fin, and is protruded up from the surface of the substrate. The first conductivity type heavily doped fin has a first end and a second end, and the first heavily doped clamping fin neighbors the first end and two the second conductivity type heavily doped fins nearest to it, and the insulation layer is arranged between the first heavily doped clamping fin and the second conductivity type heavily doped fin neighboring thereto and arranged between the first conductivity type heavily doped fin and the first heavily doped clamping fin, and the second contacts are arranged on sidewalls and a top of the first heavily doped clamping fin.

Compared with the second embodiment, the third embodiment further comprises a second heavily doped clamping fin. The second heavily doped clamping fin and the second conductivity type heavily doped fin belong to an identical conductivity type. The second heavily doped clamping fin is arranged in the doped well, is arranged in a line along the second direction, separates from the first conductivity type heavily doped fin, and is protruded up from the surface of the substrate. The second heavily doped clamping fin neighbors the second end and two the second conductivity type heavily doped fins nearest to it, and the insulation layer is arranged between the second heavily doped clamping fin and the second conductivity type heavily doped fin neighboring thereto and arranged between the first conductivity type heavily doped fin and the second heavily doped clamping fin, and the second contacts are arranged on sidewalls and a top of the second heavily doped clamping fin.

In the fourth embodiment, there are a plurality of first conductivity type heavily doped fins, a plurality of diodes and a plurality of ESD currents, and the insulation layer is arranged between the neighboring first conductivity type heavily doped fins. A first contact is arranged on sidewalls and tops of the first conductivity type heavily doped fins and the insulation layer, arranged in a line along the second direction, and coupled to the first voltage terminal. A plurality of second contacts is uniformly arranged on sidewalls and tops of the second conductivity type heavily doped fins at the two opposite sides of the first conductivity type heavily doped fins, arranged on the insulation layer, arranged in a line along the first direction, and coupled to the second voltage terminal. An amount of the first conductivity type heavily doped fins is equal to an amount of the second contacts at each side of the first conductivity type heavily doped fin.

Below, the embodiments are described in detail in cooperation with the drawings to make easily understood the technical contents, characteristics and accomplishments of the present invention.

DETAILED DESCRIPTION OF THE INVENTION

The self-balanced diode device of the present invention is used as an electrostatic discharge (ESD) protection structure needed for integrated circuits. In ESD protection, an ESD circuit is formed near integrated circuit terminals such as input and output pads, and also for power supply terminals. ESD protection circuits may provide a current discharge path so as to reduce the semiconductor failures due to ESD.

Figure 1:
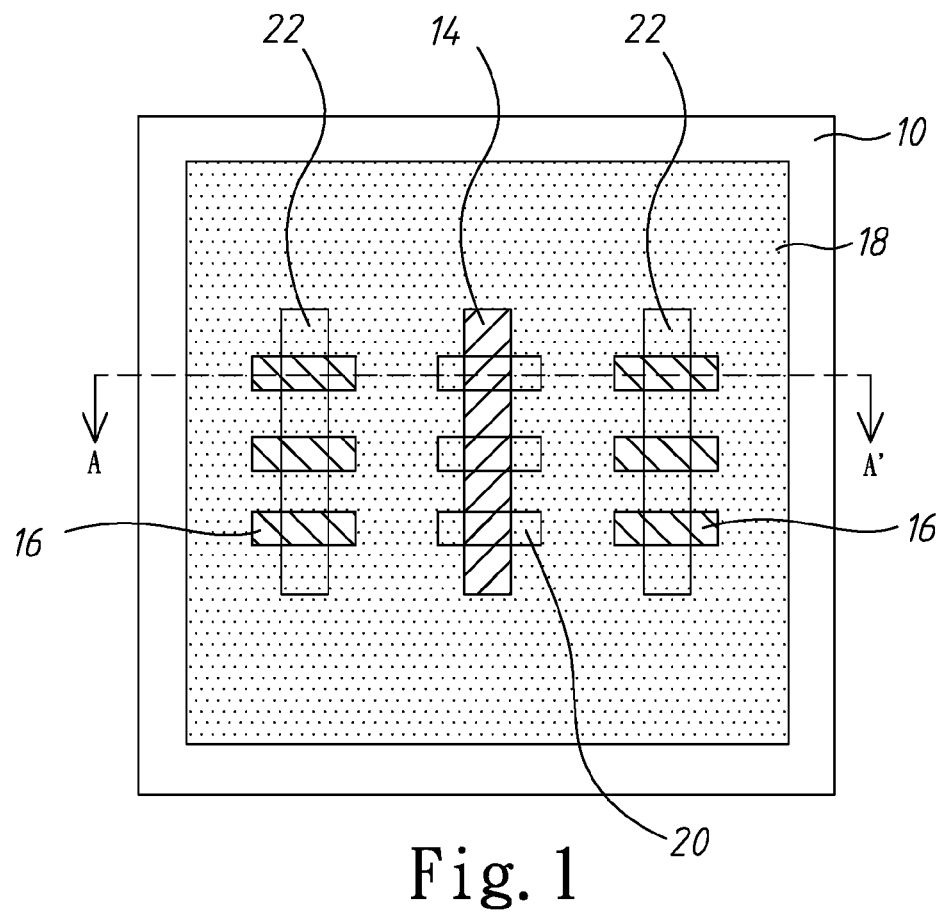
FIG. 1 is a layout schematically showing a self-balanced diode device according to the first embodiment of the present invention.
Figure 2:
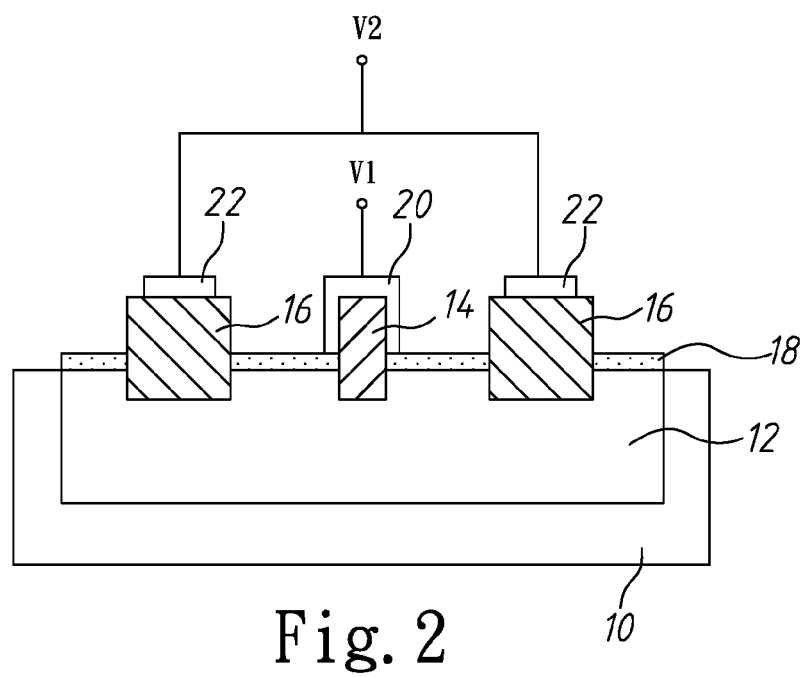
FIG. 2 is a sectional view taken along Line A-A' of FIG. 1.

Refer to FIG. 1 and FIG. 2. The first embodiment of the self-balanced diode device of the present invention is introduced as below. The first embodiment comprises a substrate 10, a doped well 12, at least one first conductivity type heavily doped fin 14, at least two second conductivity type heavily doped fins 16, an insulation layer 18, a plurality of first contacts 20 and two second contacts 22. The doped well 12, the first conductivity type heavily doped fin 14 and the second conductivity type heavily doped fins 16 can form at least two diodes to discharge at least two uniform ESD currents. In the first embodiment, an amount of the first conductivity type heavily doped fin 14 is one, and there are a plurality of second conductivity type heavily doped fins 16, a plurality of diodes and a plurality of ESD currents.

The substrate 10 is a semiconductor substrate. The doped well 12 is a P-type doped well or an N-type doped well. The doped well 12 is arranged in the substrate 10. The first conductivity type heavily doped fin 14 is arranged in the doped well 12, arranged in a line along a first direction, and protruded up from a surface of the substrate 10. The second conductivity type heavily doped fins 16 are arranged in the doped well 12, arranged in a line along a second direction intersecting the first direction, respectively arranged at two opposite sides of the first conductivity type heavily doped fin 14, and protruded up from the surface of the substrate 10. For example, the first direction is perpendicular to the second direction. Each second conductivity type heavily doped fin 16 and the first conductivity type heavily doped fin 14 are spaced at a fixed interval. The insulation layer 18 is arranged on the surface of the substrate 10, arranged between the first conductivity type heavily doped fin 14 and each second conductivity type heavily doped fin 16, and arranged between the neighboring second conductivity type heavily doped fins 16. The first contacts 20 are arranged on sidewalls and a top of the first conductivity type heavily doped fin 14 and the insulation layer 18, arranged in a line along the second direction, and coupled to a first voltage terminal V1. The first conductivity type heavily doped fin 14 is coupled to the first voltage terminal V1 through the first contacts 20. The second contacts 22 are respectively arranged on sidewalls and tops of the second conductivity type heavily doped fins 16 at the two opposite sides of the first conductivity type heavily doped fin 14, arranged on the insulation layer 18, arranged in a line along the first direction, and coupled to a second voltage terminal V2. The second conductivity type heavily doped fins 16 are coupled to the second voltage terminal V2 through the second contacts 22. An amount of the first contacts 20 is equal to an amount of the second conductivity type heavily doped fins 16 at each side of the first conductivity type heavily doped fin 14.

Voltages of the first voltage terminal and the second voltage terminal forward bias the diodes to generate the uniform ESD currents through the diodes, so as to reduce the semiconductor failures due to ESD. As a result, the first conductivity type heavily doped fin 14 is an N-type heavily doped fin, and the second conductivity type heavily doped fins 16 are P-type heavily doped fins, and the first voltage terminal V1 and the second voltage terminal V2 are respectively a low voltage terminal and a high voltage terminal. Alternatively, the first conductivity type heavily doped fin 14 is a P-type heavily doped fin, and the second conductivity type heavily doped fins 16 are N-type heavily doped fins, and the first voltage terminal V1 and the second voltage terminal V2 are respectively a high voltage terminal and a low voltage terminal.

Figure 3:
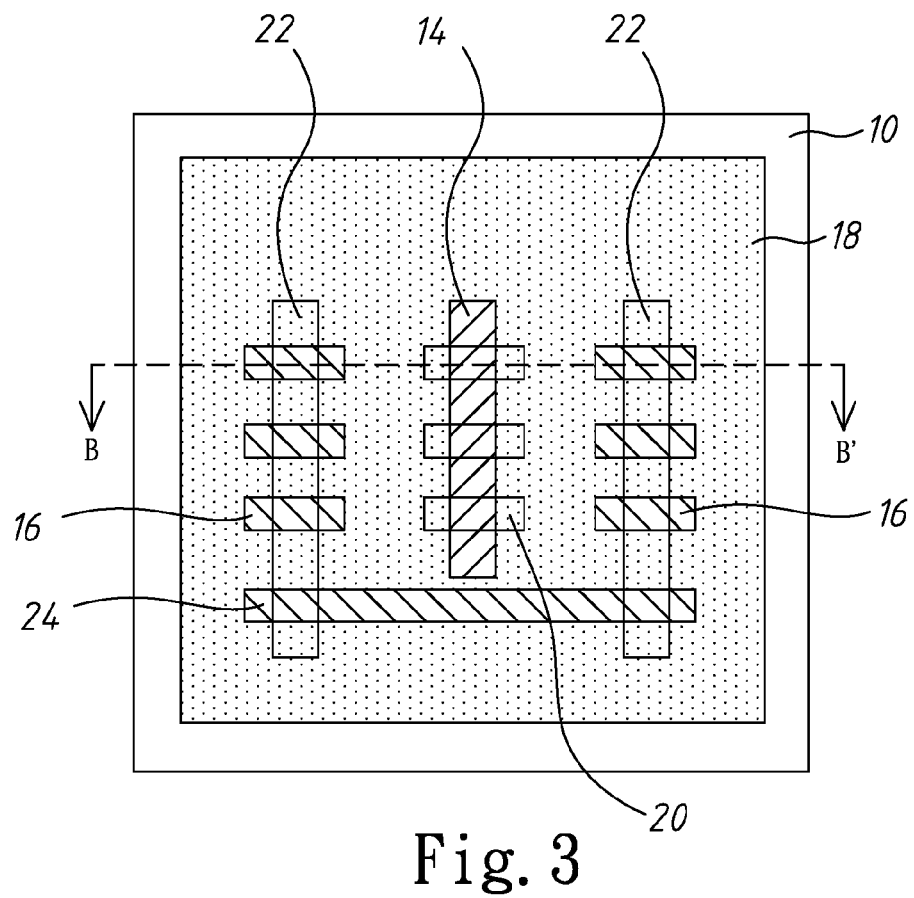
FIG. 3 is a layout schematically showing a self-balanced diode device according to the second embodiment of the present invention.
Figure 4:
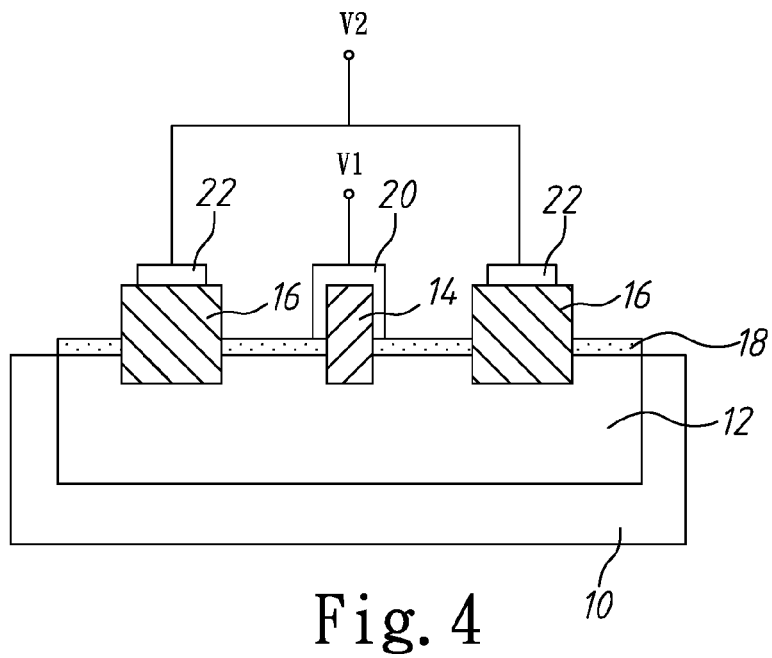
FIG. 4 is a sectional view taken along Line B-B' of FIG. 3.

Refer to FIG. 3 and FIG. 4. The second embodiment of the self-balanced diode device of the present invention is introduced as below. Compared with the first embodiment, the second embodiment further comprises a first heavily doped clamping fin 24. The first heavily doped clamping fin 24 and the second conductivity type heavily doped fin 16 belong to an identical conductivity type. The first heavily doped clamping fin 24 is arranged in the doped well 12, is arranged in a line along the second direction, separates from the first conductivity type heavily doped fin 14, and is protruded up from the surface of the substrate 10. The first conductivity type heavily doped fin 14 has a first end and a second end, and the first heavily doped clamping fin 24 neighbors the first end and two the second conductivity type heavily doped fins 16 nearest to it, and the insulation layer 18 is arranged between the first heavily doped clamping fin 24 and the second conductivity type heavily doped fin 16 neighboring thereto and arranged between the first conductivity type heavily doped fin 14 and the first heavily doped clamping fin 24, and the second contacts 22 are arranged on sidewalls and a top of the first heavily doped clamping fin 24. The first heavily doped clamping fin 24 is coupled to the second voltage terminal V2 through the second contacts 22. In the second embodiment, the doped well 12, the first conductivity type heavily doped fin 14, the second conductivity type heavily doped fins 16 and the first heavily doped clamping fin 24 can form a plurality of diodes to discharge a plurality of uniform ESD currents, so as to reduce the semiconductor failures due to ESD.

Figure 5:
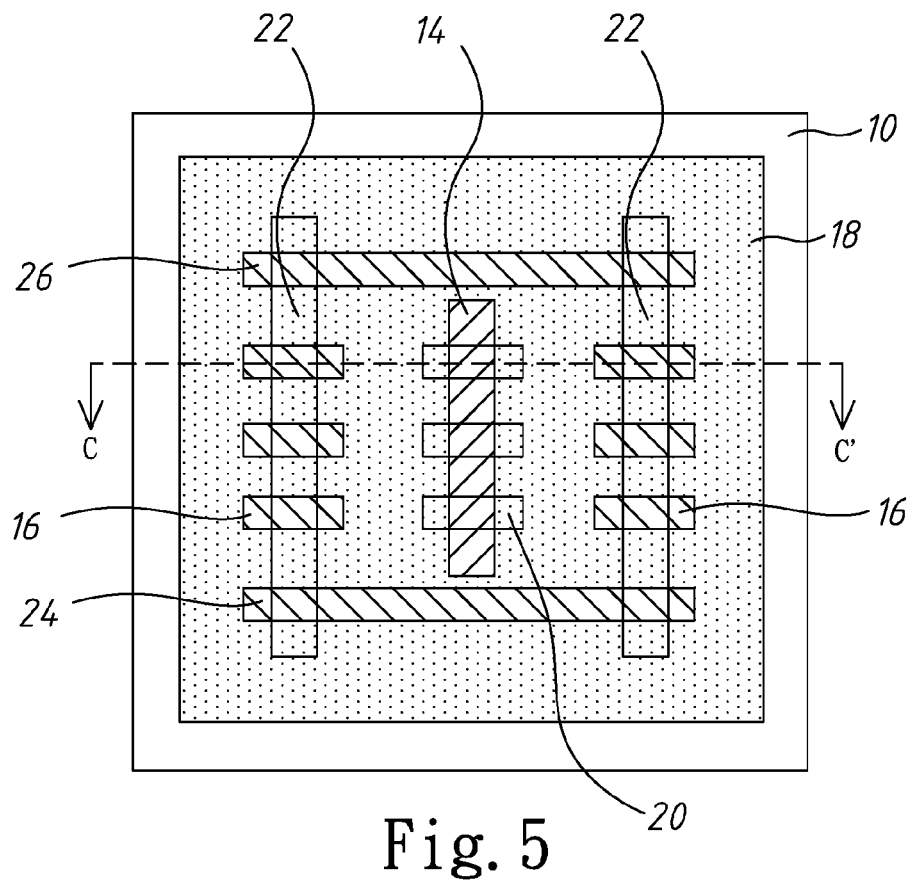
FIG. 5 is a layout schematically showing a self-balanced diode device according to the third embodiment of the present invention.
Figure 6:
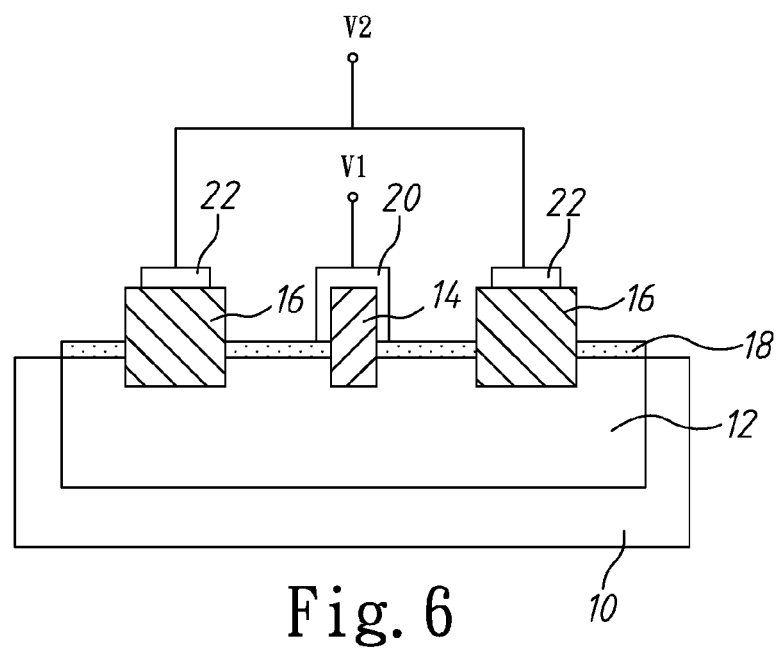
FIG. 6 is a sectional view taken along Line C-C' of FIG. 5.

Refer to FIG. 5 and FIG. 6. The third embodiment of the self-balanced diode device of the present invention is introduced as below. Compared with the second embodiment, the third embodiment further comprises a second heavily doped clamping fin 26. The second heavily doped clamping fin 26 and the second conductivity type heavily doped fin 16 belong to an identical conductivity type. The second heavily doped clamping fin 26 is arranged in the doped well 12, is arranged in a line along the second direction, separates from the first conductivity type heavily doped fin 14, and is protruded up from the surface of the substrate 10. The second heavily doped clamping fin 26 neighbors the second end and two the second conductivity type heavily doped fins 16 nearest to it, and the insulation layer 18 is arranged between the second heavily doped clamping fin 26 and the second conductivity type heavily doped fin 16 neighboring thereto and arranged between the first conductivity type heavily doped fin 14 and the second heavily doped clamping fin 26, and the second contacts 22 are arranged on sidewalls and a top of the second heavily doped clamping fin 26. The second heavily doped clamping fin 26 is coupled to the second voltage terminal V2 through the second contacts 22. In the third embodiment, the doped well 12, the first conductivity type heavily doped fin 14, the second conductivity type heavily doped fins 16, the first heavily doped clamping fin 24 and the second heavily doped clamping fin 26 can form a plurality of diodes to discharge a plurality of uniform ESD currents, so as to reduce the semiconductor failures due to ESD.

Figure 7:
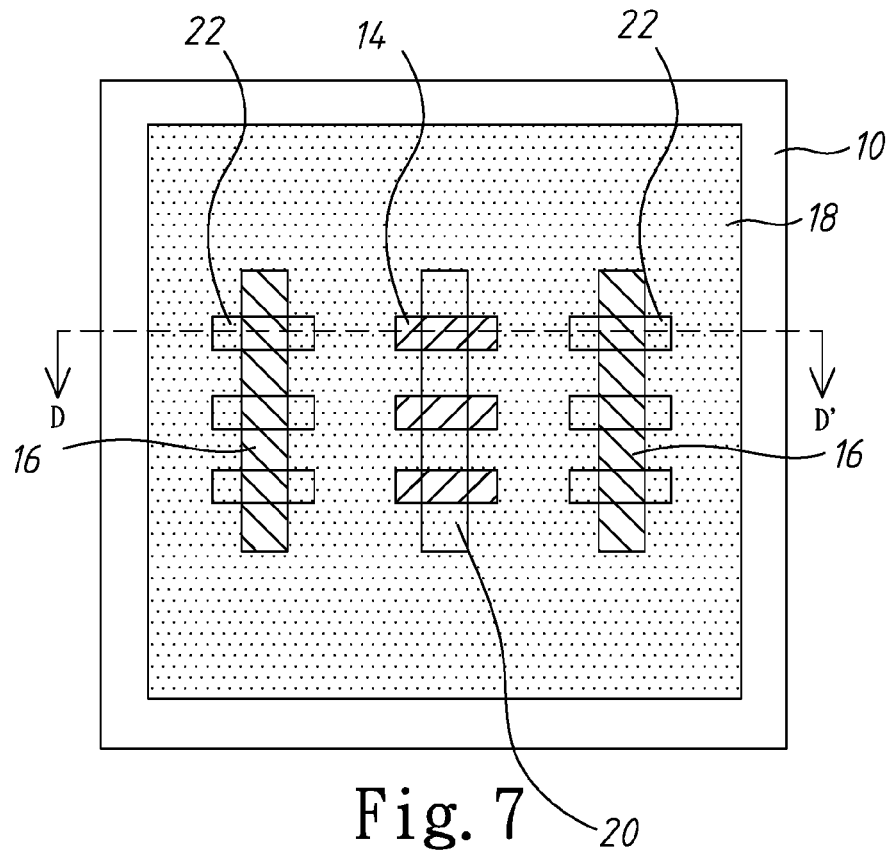
FIG. 7 is a layout schematically showing a self-balanced diode device according to the fourth embodiment of the present invention.
Figure 8:
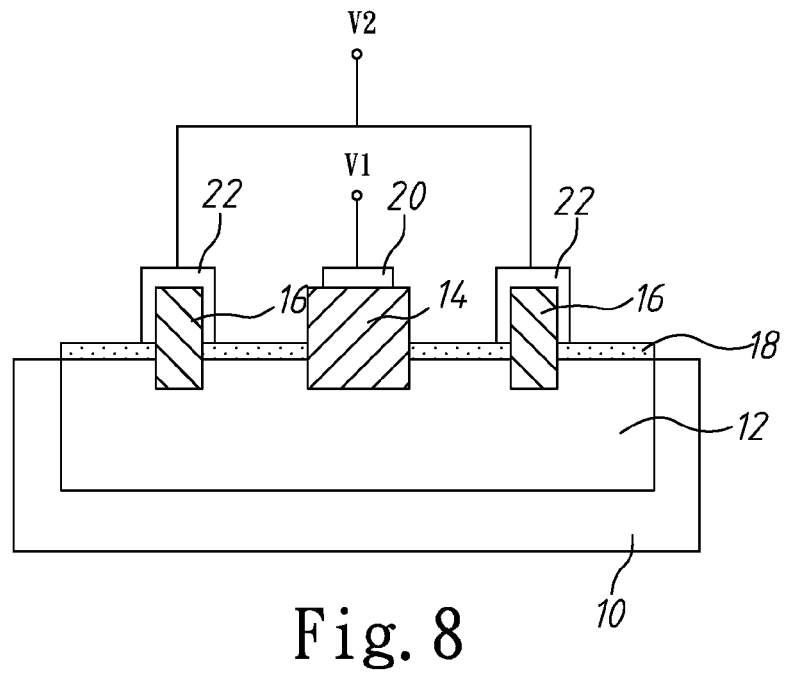
FIG. 8 is a sectional view taken along Line D-D' of FIG. 7.

Refer to FIG. 7 and FIG. 8. The fourth embodiment of the self-balanced diode device of the present invention is introduced as below. The fourth embodiment comprises a substrate 10, a doped well 12, a plurality of first conductivity type heavily doped fins 14, two second conductivity type heavily doped fins 16, an insulation layer 18, a first contact 20 and a plurality of second contacts 22. The doped well 12, the first conductivity type heavily doped fins 14 and the second conductivity type heavily doped fins 16 can form a plurality of diodes to discharge a plurality of uniform ESD currents.

The substrate 10 is a semiconductor substrate. The doped well 12 is a P-type doped well or an N-type doped well. The doped well 12 is arranged in the substrate 10. The first conductivity type heavily doped fins 14 are arranged in the doped well 12, arranged in a line along a first direction, and protruded up from a surface of the substrate 10. The second conductivity type heavily doped fins 16 are arranged in the doped well 12, arranged in a line along a second direction intersecting the first direction, respectively arranged at two opposite sides of the first conductivity type heavily doped fins 14, and protruded up from the surface of the substrate 10. For example, the first direction is perpendicular to the second direction. Each second conductivity type heavily doped fin 16 and the first conductivity type heavily doped fin 14 are spaced at a fixed interval. The insulation layer 18 is arranged on the surface of the substrate 10, arranged between each first conductivity type heavily doped fin 14 and each second conductivity type heavily doped fin 16, and arranged between the neighboring first conductivity type heavily doped fins 14. The first contact 20 is arranged on sidewalls and tops of the first conductivity type heavily doped fins 14 and the insulation layer 18, arranged in a line along the second direction, and coupled to the first voltage terminal V1. The first conductivity type heavily doped fin 14 is coupled to the first voltage terminal V1 through the first contacts 20. The second contacts 22 are uniformly arranged on sidewalls and tops of the second conductivity type heavily doped fins 16 at the two opposite sides of the first conductivity type heavily doped fins 14, arranged on the insulation layer 18, arranged in a line along the first direction, and coupled to the second voltage terminal V2. The second conductivity type heavily doped fins 16 are coupled to the second voltage terminal V2 through the second contacts 22. An amount of the first conductivity type heavily doped fins 14 is equal to an amount of the second contacts 22 at each side of the first conductivity type heavily doped fin 14.

Voltages of the first voltage terminal and the second voltage terminal forward bias the diodes to generate the uniform ESD currents through the diodes, so as to reduce the semiconductor failures due to ESD. As a result, the first conductivity type heavily doped fin 14 is an N-type heavily doped fin, and the second conductivity type heavily doped fins 16 are P-type heavily doped fins, and the first voltage terminal V1 and the second voltage terminal V2 are respectively a low voltage terminal and a high voltage terminal. Alternatively, the first conductivity type heavily doped fin 14 is a P-type heavily doped fin, and the second conductivity type heavily doped fins 16 are N-type heavily doped fins, and the first voltage terminal V1 and the second voltage terminal V2 are respectively a high voltage terminal and a low voltage terminal.

In conclusion, the present invention uses the first conductivity type heavily doped fin arranged in a line along a first direction and the second conductivity type heavily doped fins arranged in a line along a second direction intersecting the first direction to establish uniform ESD currents, so as to reduce the semiconductor failures due to ESD.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A self-balanced diode device comprising:
   a substrate;
   a doped well arranged in said substrate;
   at least one first conductivity type heavily doped fin arranged in said doped well, arranged in a line along a first direction, and protruded up from a surface of said substrate;
   at least two second conductivity type heavily doped fins arranged in said doped well, arranged in a line along a second direction intersecting said first direction, respectively arranged at two opposite sides of said first conductivity type heavily doped fin, and protruded up from said surface of said substrate, and each said second conductivity type heavily doped fin and said first conductivity type heavily doped fin are spaced at a fixed interval, and said doped well, said first conductivity type heavily doped fin and said second conductivity type heavily doped fins form at least two diodes, and said first conductivity type heavily doped fin is coupled to a first voltage terminal, and said second conductivity type heavily doped fins are coupled to a second voltage terminal, and voltages of said first voltage terminal and said second voltage terminal forward bias said diodes to generate at least two uniform electrostatic discharge (ESD) currents through said diodes;
   an insulation layer arranged on said surface of said substrate and arranged between said first conductivity type heavily doped fin and each said second conductivity type heavily doped fin;
   wherein said at least one first conductivity type heavily doped fin is a plurality of first conductivity type heavily doped fins, and said insulation layer is arranged between neighboring said first conductivity type heavily doped fins, and each of said at least two diodes is a plurality of said diodes, and each of said at least two ESD currents is a plurality of said ESD currents.

2. The self-balanced diode device according to claim 1, wherein said doped well is a P-type doped well or an N-type doped well.

3. The self-balanced diode device according to claim 1, wherein said first conductivity type heavily doped fin is an N-type heavily doped fin, and said second conductivity type heavily doped fins are P-type heavily doped fins, and said first voltage terminal and said second voltage terminal are respectively a low voltage terminal and a high voltage terminal; and said first conductivity type heavily doped fin is a P-type heavily doped fin, and said second conductivity type heavily doped fins are N-type heavily doped fins, and said first voltage terminal and said second voltage terminal are respectively a high voltage terminal and a low voltage terminal.

4. The self-balanced diode device according to claim 1, wherein said first direction is perpendicular to said second direction.

5. The self-balanced diode device according to claim 1, wherein each of said at least two second conductivity type heavily doped fins is a plurality of said second conductivity type heavily doped fins, and said insulation layer is arranged between neighboring said second conductivity type heavily doped fins, and each of said at least two diodes is a plurality of said diodes, and each of said at least two ESD currents is a plurality of said ESD currents.

6. The self-balanced diode device according to claim 1, further comprising:
   a plurality of first contacts arranged on sidewalls and a top of said first conductivity type heavily doped fin and said insulation layer, arranged in a line along said second direction, and coupled to said first voltage terminal; and
   two second contacts respectively arranged on sidewalls and tops of said second conductivity type heavily doped fins at said two opposite sides, arranged on said insulation layer, arranged in a line along said first direction, and coupled to said second voltage terminal.

7. The self-balanced diode device according to claim 6, wherein an amount of said first contacts is equal to an amount of said second conductivity type heavily doped fins at each said side of said first conductivity type heavily doped fin.

8. The self-balanced diode device according to claim 6, further comprising a first heavily doped clamping fin, and said first heavily doped clamping fin and said second conductivity type heavily doped fin belong to an identical conductivity type, and said first heavily doped clamping fin is arranged in said doped well, is arranged in a line along said second direction, separates from said first conductivity type heavily doped fin, and is protruded up from said surface of said substrate, and said first conductivity type heavily doped fin has a first end and a second end, and said first heavily doped clamping fin neighbors said first end and two said second conductivity type heavily doped fins nearest to it, and said insulation layer is arranged between said first heavily doped clamping fin and said second conductivity type heavily doped fin neighboring thereto and arranged between said first conductivity type heavily doped fin and said first heavily doped clamping fin, and said second contacts are arranged on sidewalls and a top of said first heavily doped clamping fin.

9. The self-balanced diode device according to claim 8, further comprising a second heavily doped clamping fin, and said second heavily doped clamping fin and said second conductivity type heavily doped fin belong to an identical conductivity type, and said second heavily doped clamping fin is arranged in said doped well, is arranged in a line along said second direction, separates from said first conductivity type heavily doped fin, and is protruded up from said surface of said substrate, and said second heavily doped clamping fin neighbors said second end and two said second conductivity type heavily doped fins nearest to it, and said insulation layer is arranged between said second heavily doped clamping fin and said second conductivity type heavily doped fin neighboring thereto and arranged between said first conductivity type heavily doped fin and said second heavily doped clamping fin, and said second contacts are arranged on sidewalls and a top of said second heavily doped clamping fin.

10. The self-balanced diode device according to claim 1, further comprising:
   a first contact arranged on sidewalls and tops of said first conductivity type heavily doped fins and said insulation layer, arranged in a line along said second direction, and coupled to said first voltage terminal; and
   a plurality of second contacts uniformly arranged on sidewalls and tops of said second conductivity type heavily doped fins at said two opposite sides, arranged on said insulation layer, arranged in a line along said first direction, and coupled to said second voltage terminal.

11. The self-balanced diode device according to claim 10, wherein an amount of said first conductivity type heavily doped fins is equal to an amount of said second contacts at each said side of said first conductivity type heavily doped fin.

12. The self-balanced diode device according to claim 1, wherein said substrate is a semiconductor substrate.

\* \* \* \* \*